United States Patent
Ushijima et al.

(10) Patent No.: US 9,646,912 B2
(45) Date of Patent: May 9, 2017

(54) SEMICONDUCTOR DEVICE AND SEMICONDUCTOR MODULE HAVING COOLING FINS

(71) Applicant: Mitsubishi Electric Corporation, Tokyo (JP)

(72) Inventors: Koichi Ushijima, Fukuoka (JP); Khalid Hassan Hussein, Tokyo (JP); Shoji Saito, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/892,789

(22) PCT Filed: Sep. 10, 2013

(86) PCT No.: PCT/JP2013/074348
§ 371 (c)(1),
(2) Date: Nov. 20, 2015

(87) PCT Pub. No.: WO2015/037047
PCT Pub. Date: Mar. 19, 2015

(65) Prior Publication Data
US 2016/0104654 A1 Apr. 14, 2016

(51) Int. Cl.
*H01L 23/36* (2006.01)
*H01L 23/40* (2006.01)
(Continued)

(52) U.S. Cl.
CPC ...... *H01L 23/3672* (2013.01); *H01L 23/3677* (2013.01); *H01L 23/4006* (2013.01);
(Continued)

(58) Field of Classification Search
CPC ............. H01L 23/3672; H01L 23/3677; H01L 23/4006; H01L 23/4012; H01L 23/4093; H01L 23/473
See application file for complete search history.

(56) References Cited

U.S. PATENT DOCUMENTS 2,751,528 A * 6/1956 Burton ................. H01L 23/473
165/185
3,918,084 A * 11/1975 Schierz ................. H01L 23/473
165/80.4
(Continued)

FOREIGN PATENT DOCUMENTS

EP 0901166 A1 3/1999
JP 06-268125 A 9/1994
(Continued)

OTHER PUBLICATIONS

Notification of Transmittal of Translation of the International Preliminary Report on Patentability and Translation of Written Opinion of the International Searching Authority; PCT/JP2013/074348 issued on Mar. 24, 2016.
(Continued)

Primary Examiner — Ida M Soward
(74) Attorney, Agent, or Firm — Studebaker & Brackett PC (57) ABSTRACT

A semiconductor module having a plurality of cooling fins and a fixing cooling fin longer than the plurality of cooling fins, the fixing cooling fin having a threaded hole provided in distal end portion thereof, a cooling jacket having a cooling medium passage in which the plurality of cooling fins and the fixing cooling fin are housed, and an opening formed so as to enable a screw to be inserted in the threaded hole, and a screw passed through the opening to be inserted
(Continued)

in the threaded hole, the cooling jacket being fixed to the semiconductor module with the screw are provided.

6 Claims, 12 Drawing Sheets

(51) Int. Cl.
*H01L 23/367* (2006.01)
*H01L 23/473* (2006.01)
*H01L 23/495* (2006.01)

(52) U.S. Cl.
CPC ...... *H01L 23/4012* (2013.01); *H01L 23/4093* (2013.01); *H01L 23/473* (2013.01); *H01L 23/49562* (2013.01); *H01L 2023/4031* (2013.01); *H01L 2023/4087* (2013.01); *H01L 2924/0002* (2013.01)

(56) References Cited

U.S. PATENT DOCUMENTS

| | | | | |
|---|---|---|---|---|
| 5,065,280 A * | 11/1991 | Karnezos | ............ | H01L 23/4006 165/185 |
| 5,483,103 A * | 1/1996 | Blickhan | ............ | H01L 23/4006 257/718 |
| 5,504,650 A | 4/1996 | Katsui et al. | | |
| 5,597,034 A * | 1/1997 | Barker, III | ............ | H01L 23/467 165/121 |
| 5,648,889 A * | 7/1997 | Bosli | ............ | H01L 23/4006 257/717 |
| 5,932,925 A * | 8/1999 | McIntyre | ............ | H01L 23/4093 165/185 |
| 6,206,087 B1 * | 3/2001 | Nakase | ............ | H01L 23/467 165/121 |
| 6,209,623 B1 * | 4/2001 | Tantoush | ............ | H01L 23/4006 165/80.3 |
| 6,243,263 B1 * | 6/2001 | Kitahara | ............ | H01L 23/467 165/104.33 |
| 6,412,252 B1 * | 7/2002 | Sarles | ............ | B29C 65/3656 219/632 |
| 7,375,963 B2 * | 5/2008 | Eckberg | ............ | H01L 23/4006 165/185 |
| 7,428,154 B2 * | 9/2008 | Ishimine | ............ | H01L 23/4006 165/185 |
| 7,436,672 B2 * | 10/2008 | Ushijima | ............ | H01L 25/162 165/104.33 |
| 7,486,516 B2 * | 2/2009 | Colbert | ............ | H01L 23/4006 257/718 |
| 7,749,014 B2 * | 7/2010 | Chiang | ............ | H01L 23/32 439/331 |
| 7,790,511 B2 * | 9/2010 | Chainer | ............ | H01L 23/40 257/678 |
| 9,196,566 B2 * | 11/2015 | Komatsu | ............ | H01L 23/4093 |
| 2004/0036492 A1 * | 2/2004 | Gaasch | ............ | G01R 1/0458 324/750.09 |
| 2005/0133201 A1 | 6/2005 | Liu | | |
| 2011/0181105 A1 * | 7/2011 | Michinaka | ............ | H01L 25/162 307/9.1 |
| 2012/0008286 A1 * | 1/2012 | Suzuki | ............ | B60L 11/14 361/730 |
| 2012/0241953 A1 * | 9/2012 | Yamada | ............ | H01L 23/4334 257/737 |
| 2013/0241046 A1 * | 9/2013 | Miyashita | ............ | H01L 23/3731 257/705 |
| 2014/0145526 A1 * | 5/2014 | Shirakata | ............ | H02K 5/10 310/52 |
| 2014/0361424 A1 * | 12/2014 | Horio | ............ | H02M 7/003 257/704 |
| 2015/0216089 A1 * | 7/2015 | Tanaka | ............ | H05K 7/209 361/699 |
| 2015/0289356 A1 * | 10/2015 | Izuo | ............ | H01L 23/13 361/709 |

FOREIGN PATENT DOCUMENTS

| | | |
|---|---|---|
| JP | 11-121691 A | 4/1999 |
| JP | 2004-103936 A | 4/2004 |
| JP | 2004-179186 A | 6/2004 |
| JP | 2007-110025 A | 4/2007 |
| JP | 2007-189159 A | 7/2007 |
| JP | 2008-270297 A | 11/2008 |
| JP | 2010-165716 A | 7/2010 |
| JP | 2011-060914 A | 3/2011 |
| JP | 2011-103369 A | 5/2011 |

OTHER PUBLICATIONS

International Search Report—PCT/JP2013/074348 dated Dec. 10, 2013.

* cited by examiner

FIG.16

SEMICONDUCTOR DEVICE AND SEMICONDUCTOR MODULE HAVING COOLING FINS

TECHNICAL FIELD

This invention relates to a semiconductor device for use, for example, as a power controller and to a semiconductor module.

BACKGROUND ART

Patent Literature 1 discloses a semiconductor device having a cooling jacket fixed to a semiconductor module. In this semiconductor device, the cooling jacket is fixed to the semiconductor module by passing screws through openings formed in the cooling jacket and by inserting the screws in threaded holes formed in a heat radiating base of the semiconductor module.

PRIOR ART

Patent literature

Patent Literature 1: Japanese Patent Laid-Open No. 2007-110025

SUMMARY OF INVENTION

Technical Problem

It is preferable to make semiconductor devices as small as possible. The semiconductor device disclosed in the Patent Literature 1, however, requires securing spaces for providing threaded holes in the heat radiating base. This means that the structure of the device is disadvantageous in terms of size-reduction design.

The present invention has been achieved to solve the above-described problem, and an object of the present invention is to provide a semiconductor device and a semiconductor module capable of being reduced in size.

Means for Solving the Problems

A semiconductor device of the claimed invention includes a semiconductor module having a plurality of cooling fins and a fixing cooling fin longer than the plurality of cooling fins, the fixing cooling fin having a threaded hole provided in distal end portion thereof, a cooling jacket having a cooling medium passage in which the plurality of cooling fins and the fixing cooling fin are housed, and an opening formed so as to enable a screw to be inserted in the threaded hole, and a screw passed through the opening to be inserted in the threaded hole, the cooling jacket being fixed to the semiconductor module with the screw.

A semiconductor device of another claimed invention includes a semiconductor module having a plurality of cooling fins, and a cooling jacket having a cooling medium passage in which the plurality of cooling fins are housed, wherein a snap-fitting mechanism for fixing the semiconductor module to the cooling jacket is formed on the semiconductor module and the cooling jacket.

A semiconductor module of the claimed invention includes a plurality of cooling fins, and a fixing cooling fin longer than the plurality of cooling fins, the fixing cooling fin having a threaded hole provided in a distal end portion thereof.

A semiconductor module of another claimed invention includes a plurality of cooling fins, and a hook extending in the same direction as the plurality of cooling fins.

Other features of the present invention will become clear from the following description.

Advantageous Effect of Invention

According to this invention, the semiconductor device and the semiconductor module can be reduced in size.

DESCRIPTION OF EMBODIMENTS

A semiconductor device according to an embodiment of the present invention and a semiconductor module which is a portion of the semiconductor device will be described with reference to the drawings. Components identical or corresponding to each other are assigned the same reference characters and repeated description of them is avoided in some cases.

Embodiment 1

Figure 1:
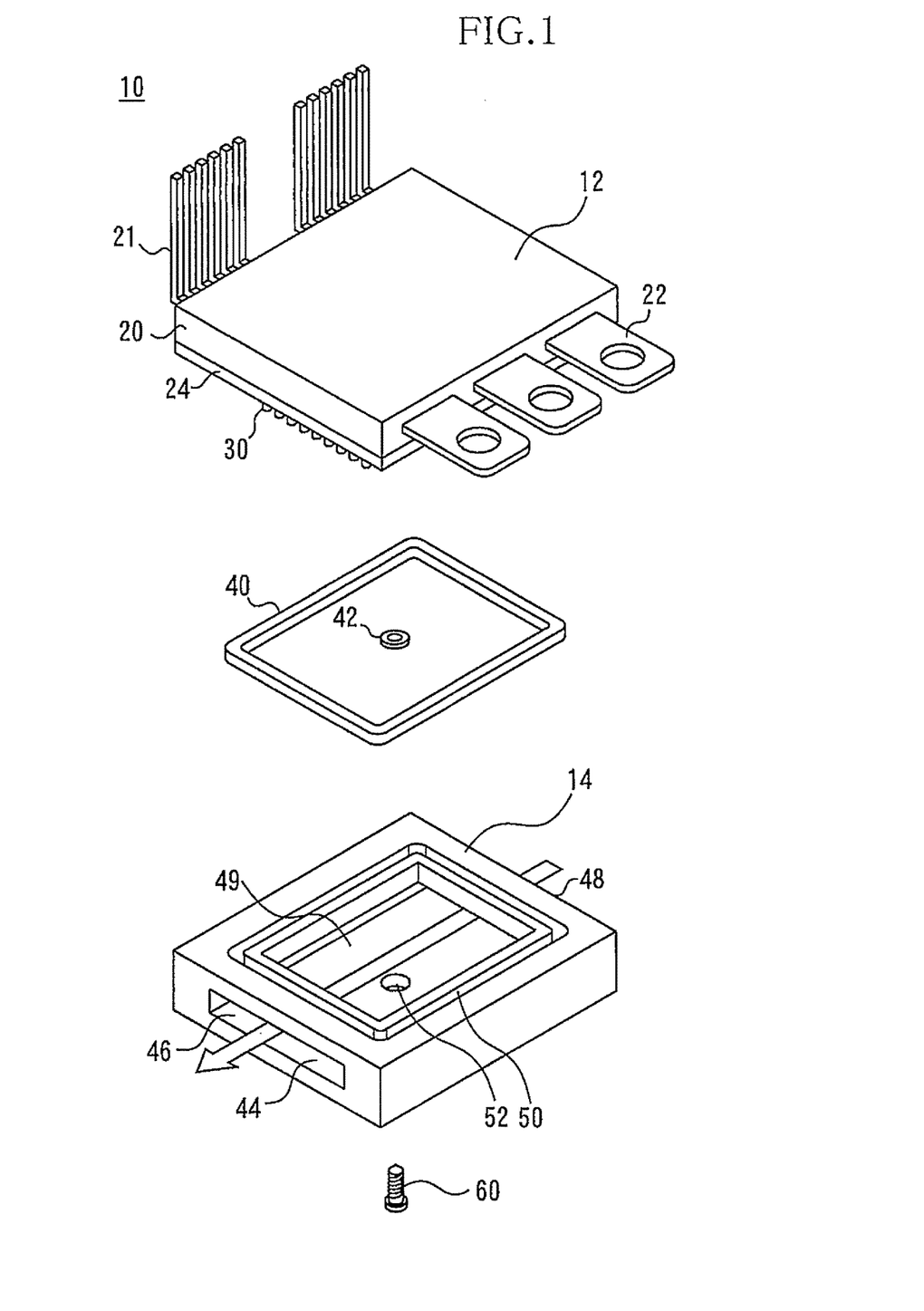
FIG. 1 is an exploded view of a semiconductor device according to Embodiment 1 of the present invention.

FIG. 1 is an exploded view of a semiconductor device 10 according to Embodiment 1 of the present invention. The semiconductor device 10 includes a semiconductor module 12 and a cooling jacket 14 fixed to the semiconductor module 12. The semiconductor module 12 will first be described. The semiconductor module 12 includes a molding resin 20 for encapsulation of a semiconductor element, e.g., an insulated gate bipolar transistor (IGBT).

Figure 2:
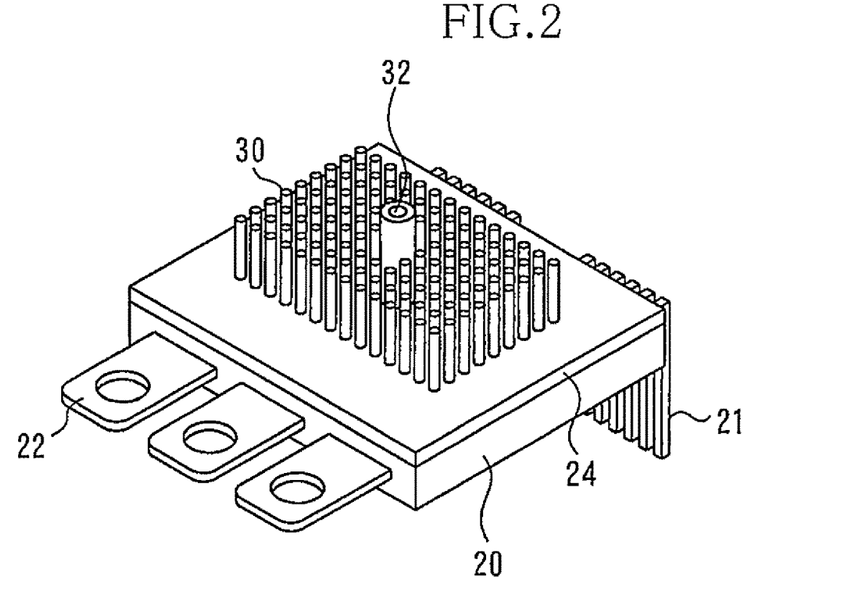
FIG. 2 is a perspective view of the semiconductor module as seen from the bottom side.

Control terminals 21 and main electrodes 22 are exposed from side surfaces of the molding resin 20 to the outside. A base plate 24 formed of a metal is fixed to a bottom surface of the molding resin 20. FIG. 2 is a perspective view of the semiconductor module 12 as seen from the bottom side. A plurality of cooling fins 30 and a fixing cooling fin 32 are provided adjoining to the base plate 24. The plurality of cooling fins 30 and the fixing cooling fin 32 are formed of the same material as the base plate 24 and are formed integrally with the base plate 24.

The cooling fins 30 are formed, for example, of pin fins. The cooling fins 30, however, may be formed of any other type of fins. The fixing cooling fin 32 is longer than the cooling fins 30. Therefore, the fixing cooling fin 32 projects outward from the semiconductor module 12 further than the cooling fins 30. A threaded hole is formed in a distal end portion of the fixing cooling fin 32. The fixing cooling fin 32 as described above is formed, for example of a boss with a threaded hole. The plurality of cooling fins 30 and the fixing cooling fin 32 are provided on a central portion of the base plate 24. Accordingly, the plurality of cooling fins 30 and the fixing cooling fin 32 are not provided on a peripheral portion of the base plate 24. The fixing cooling fin 32 is provided substantially at a center of the base plate 24.

Referring back to FIG. 1, an O-ring 40 and an O-ring 42 are provided between the semiconductor module 12 and the cooling jacket 14. The cooling jacket 14 will subsequently be described. A cooling medium passage 44 is formed in the cooling jacket 14. A direction in which a cooling medium flows is indicated by an arrow. To enable the cooling medium to flow in this direction, passage openings 46 and 48 are formed in two side surfaces of the cooling jacket 14 opposed to each other.

An introduction opening 49 for introducing the plurality of cooling fins 30 and the fixing cooling fin 32 into the cooling medium passage 44 is formed in the cooling jacket 14 at the upper surface side of the same. The plurality of cooling fins 30 and the fixing cooling fin 32 are passed through the introduction opening 49 to be housed in the cooling medium passage 44.

An annular groove 50 is formed in a surface (upper surface) of the cooling jacket 14 opposed to the semiconductor module 12. This groove 50 surrounds the plurality of cooling fins 30 and the fixing cooling fin 32 when the semiconductor device 10 is completed. The above-mentioned O-ring 40 is housed in this groove 50.

An opening 52 is formed in the cooling jacket 14 to enable a screw 60 to be inserted in the threaded hole in the fixing cooling fin 32 housed in the cooling medium passage 44. The shaft of the screw 60 is passed through the opening 52, inserted in the threaded hole of the fixing cooling fin 32, and turned in the tightening direction until the head of the screw 60 abuts on the outer wall surface of the cooling jacket 14, thereby fixing the cooling jacket 14 on the semiconductor module 12.

Figure 3:
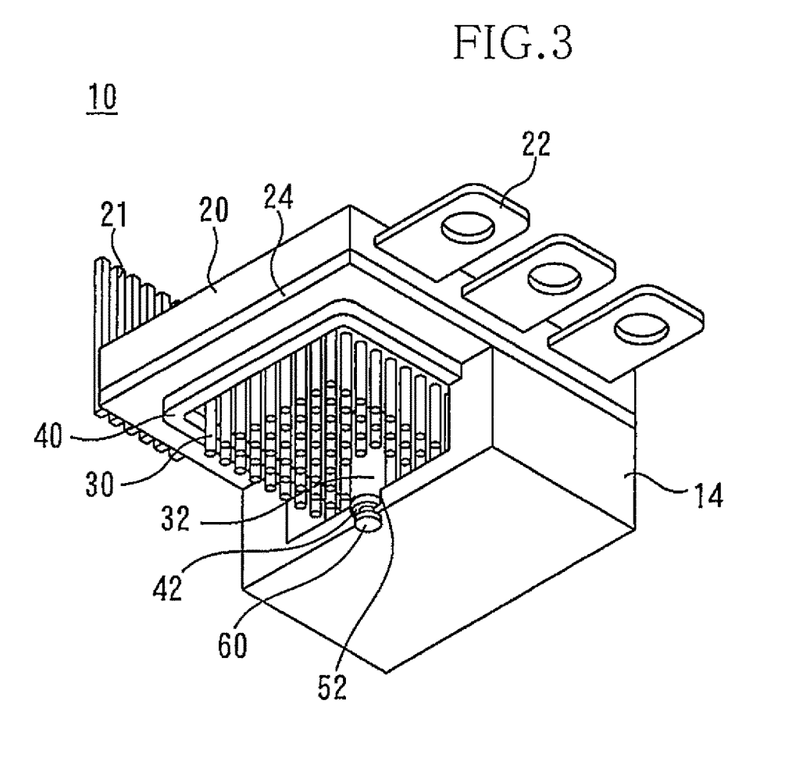
FIG. 3 is a perspective view of the semiconductor device.

FIG. 3 is a perspective view of the semiconductor device 10. For ease of description, only a half of the cooling jacket 14 is shown. The O-ring 42 is elastically deformed by being pinched between the cooling jacket 14 and the fixing cooling fin 32. This will be explained with reference to FIGS. 4 and 5.

Figure 4:
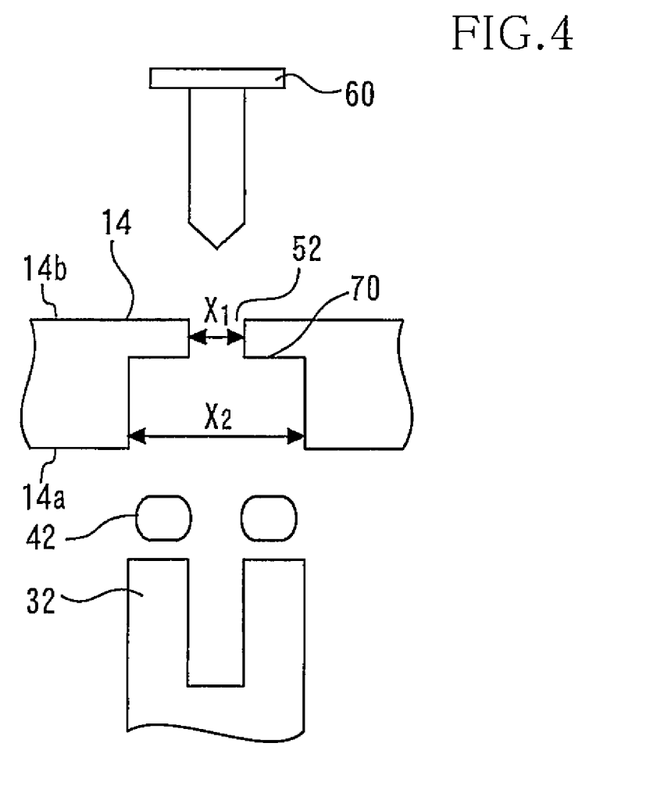
FIG. 4 is a sectional view of the opening and portions around the opening.

FIG. 4 is a sectional view of the opening 52 and portions around the opening 52. A width (X2) at an inner wall 14a side of the opening 52 of the cooling jacket 14 is larger than a width (X1) at an outer wall side 14b of the opening 52. A counterbore 70 is thereby formed in the inner wall surface of the cooling jacket 14. The width of the counterbore 70 is equal to the width of the fixing cooling fin 32.

Figure 5:
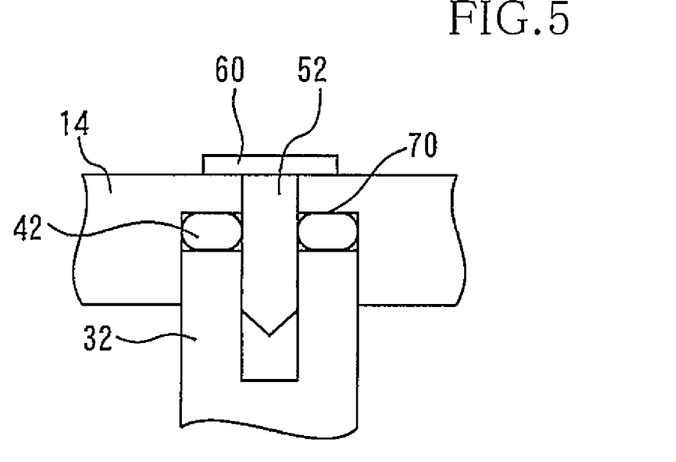
FIG. 5 is a sectional view of the opening and the portions around the opening after being fastened with the screw.

FIG. 5 is a sectional view of the opening and the portions around the opening after being fastened with the screw. The distal end portion of the fixing cooling fin 32 is housed in the counterbore 70. At this time, the O-ring 42 is set between the distal end portion and the bottom surface of the counterbore 70. In this state, the screw 60 is inserted in the threaded hole. Force to press the cooling jacket 14 against the semiconductor module 12 can be produced by tightening the screw 60.

By this force, the O-ring 40 provided in the groove 50 is elastically deformed to close the gap between the cooling jacket 14 and the semiconductor module 12, and the O-ring 42 is simultaneously deformed elastically to close the gap between the distal end portion of the fixing cooling fin 32 and the bottom surface of counterbore 70. Consequently, the cooling medium flowing in the cooling medium passage 44 can be enclosed in the cooling medium passage 44 with the O-rings 40 and 42. The outside diameters of the O-rings 40 and 42, the shape of the groove 50, the depth of the counterbore 70 and the length of the fixing cooling fin 32 are changed as required to set the amounts of elastic deformation of the O-rings 40 and 42 to values optimal for enclosing the cooling medium.

In the semiconductor device 10 according to Embodiment 1 of the present invention, the fixing cooling fin 32 used to fix the semiconductor module 12 and the cooling jacket 14 to each other is provided along with the plurality of cooling fins 30. That is, the fixing cooling fin 32 is provided in a place corresponding to a place in the conventional device where a cooling fin is provided, thus enabling prevention of an increase in size of the semiconductor device. Besides, the fixing cooling fin 32 contributes to cooling of the semiconductor module 12, as does each of the plurality of cooling fins 30. Thus, the semiconductor module 12 can be efficiently cooled and, moreover, the semiconductor device 10 can be reduced in size.

The O-ring 40 is provided in the groove 50 and the O-ring 42 is provided in the counterbore 70. There is, therefore, no possibility of the entire O-ring 40 contacting the cooling medium or no possibility of the entire O-ring 42 contacting the cooling medium. Therefore, the durability of the O-rings 40 and 42 can be improved in comparison with a case where the entire O-rings 40 and 42 contact the cooling medium. In particular, as can be understood from FIG. 5, substantially no contact occurs between the O-ring 42 provided in the counterbore 70 and the cooling medium. The reliability of semiconductor device 10 can therefore be improved.

The semiconductor device 10 and the semiconductor module 12 according to Embodiment 1 of the present invention can be variously modified. For example, the molding resin 20 may be replaced with a case. The construction of the cooling jacket 14 may be simplified by removing the counterbore 70. These modifications can also be applied to semiconductor devices and semiconductor modules according to embodiments described below.

Embodiment 2

Figure 6:
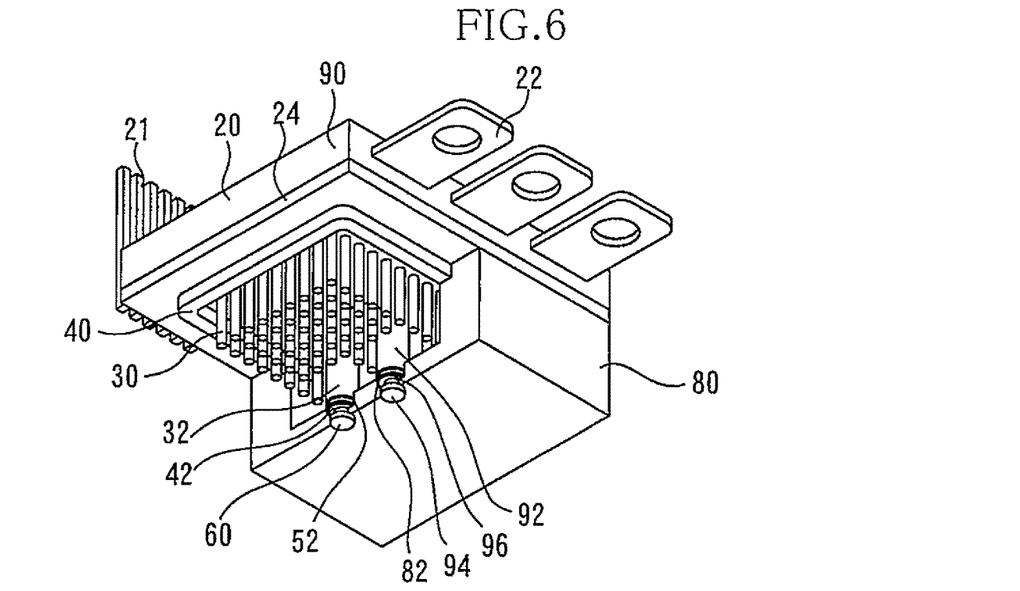
FIG. 6 is a perspective view of the semiconductor device according to Embodiment 2 of the present invention.

A semiconductor device according to Embodiment 2 of the present invention differs from the semiconductor device according to Embodiment 1 in a plurality of fixing cooling fins being provided and in other points of details. FIG. 6 is a perspective view of the semiconductor device according to Embodiment 2 of the present invention. For ease of description, only a half of a cooling jacket 80 is shown.

A semiconductor module 90 includes an additional fixing cooling fin 92 having a threaded hole provided in its distal end portion. The additional fixing cooling fin 92 is identical in shape to the fixing cooling fin 32 and connects with the base plate 24. This additional fixing cooling fin 92 is housed in a cooling medium passage.

A cooling jacket 80 has an additional opening 82 formed therein to enable a screw to be inserted in the threaded hole in the additional fixing cooling fin 92. The additional opening 82 is identical in shape to the opening 52 and has a counterbore formed therein. An additional screw 94 is passed through the additional opening 82 to be inserted in the threaded hole in the additional fixing cooling fin 92 in the same way as the screw 60 is. An O-ring 96 is provided between the bottom surface of the counterbore and the distal end of the additional fixing cooling fin 92.

In the semiconductor device according to Embodiment 2 of the present invention, the cooling jacket 80 is fixed to the semiconductor module 90 by inserting the screw 60 in the threaded hole in the fixing cooling fin 32 and inserting the additional screw 94 in the threaded hole in the additional fixing cooling fin 92. Because of using the two fixing cooling fins (fixing cooling fin 32 and additional fixing cooling fin 92), the strength of coupling between the semiconductor module and the cooling jacket can be improved in comparison with the semiconductor device in Embodiment 1.

Use of the two fixing cooling fins further enables positioning when the cooling jacket 80 is attached to the semiconductor module 90. That is, the position of the cooling jacket relative to the semiconductor module is determined by inserting the two fixing cooling fins in the openings in the cooling jacket, thereby preventing misalignment between the cooling jacket and the semiconductor module.

While two fixing cooling fins are used in Embodiment 2 of the present invention, the number of fixing cooling fins is not limited to two. Three or more fixing cooling fins may be provided.

Embodiment 3

Figure 7:
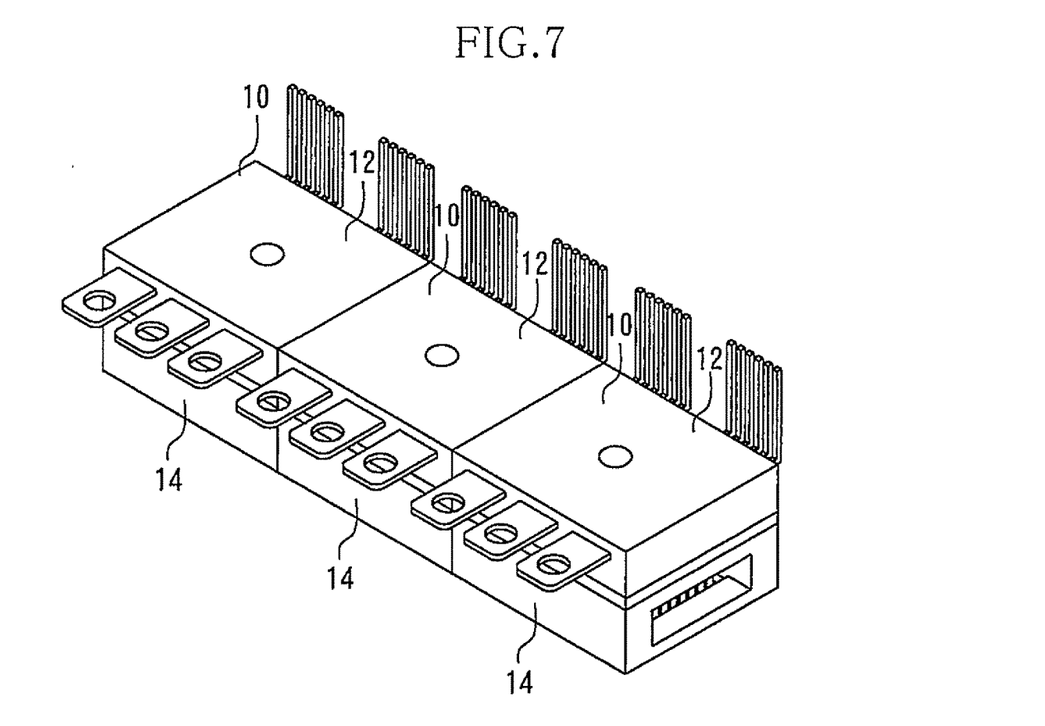
FIG. 7 is a perspective view of the semiconductor device according to Embodiment 3 of the present invention.

A semiconductor device according to Embodiment 3 of the present invention is formed by connecting a plurality of (three) semiconductor devices 10 according to Embodiment 1. FIG. 7 is a perspective view of the semiconductor device according to Embodiment 3 of the present invention. A plurality of cooling jackets 14 is connected so as to form one continuous cooling medium passage. Each adjacent pair of cooling jackets 14 is fixed (connected) by means of a fitting structure capable of enclosing the cooling medium. This way, the plurality of semiconductor modules 12 constituting, for example, a three-phase inverter can be integrated in a small space.

The number of semiconductor devices 10 connected one another is not limited to any particular number. Also, a plurality of the semiconductor devices according to Embodiment 2 may be connected.

Embodiment 4

Figure 8:
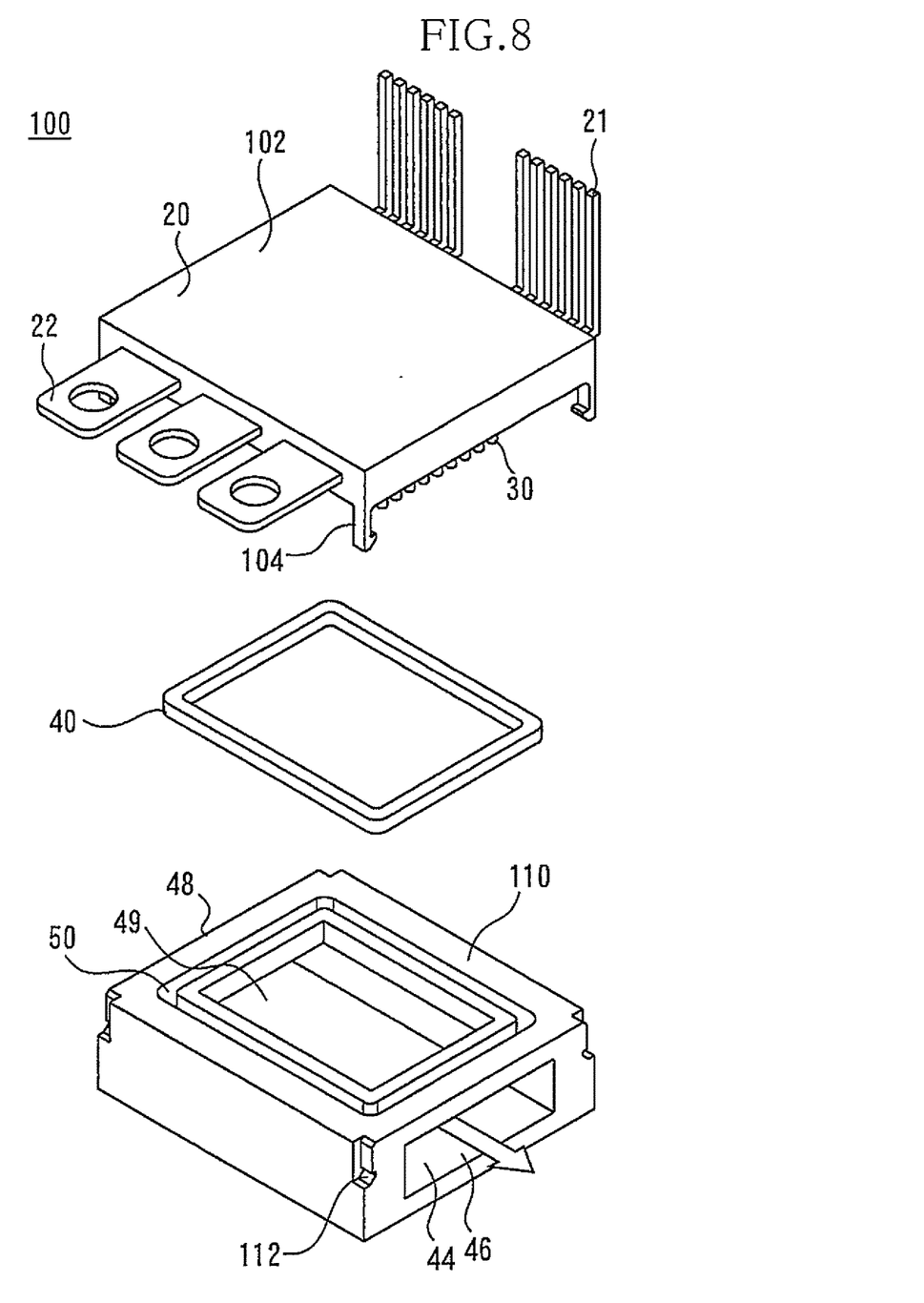
FIG. 8 is an exploded view of a semiconductor device according to Embodiment 4 of the present invention.

A semiconductor device and a semiconductor module according to Embodiment 4 have a lot in common with those in Embodiment 1 and will therefore be described mainly with respect to points of difference from Embodiment 1. FIG. 8 is an exploded view of a semiconductor device 100 according to Embodiment 4 of the present invention. Hooks 104 are formed on a semiconductor module 102. The hooks 104 extend in the same direction as the plurality of cooling fins 30. The hooks 104 are formed of the same material as the molding resin 20 so as to connect with four corner portions of the molding resin 20. The hooks 104 may alternatively be formed of the same material as the base plate so as to connect with the base plate.

Figure 9:
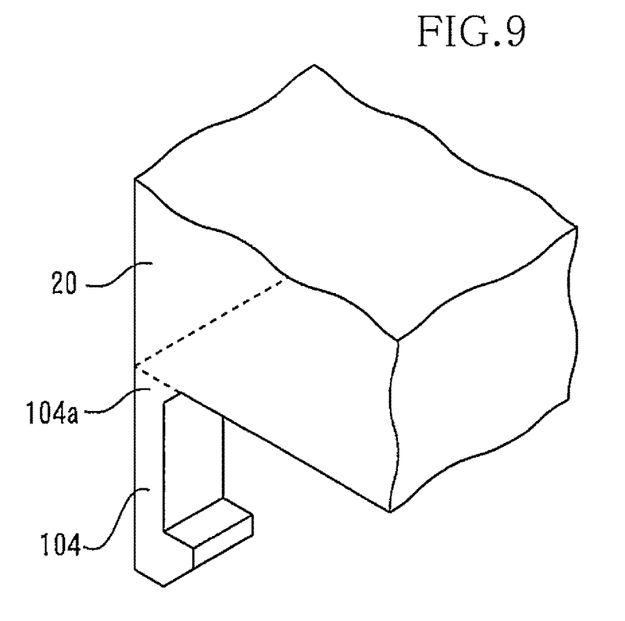
FIG. 9 is a perspective view of the hook.

FIG. 9 is a perspective view of the hook. The hook 104 has its base end portion 104a tapered. Accordingly, the hook 104 is made thicker in its base end portion 104a. Referring back to FIG. 8, hook grooves 112 having a shape for snap-fit fixing to the above-described hooks 104 are formed in a cooling jacket 110. The hook grooves 112 are formed in four corner portions of the cooling jacket 110. The hook grooves 112 and the hooks 104 form a snap-fitting mechanism.

Figure 10:
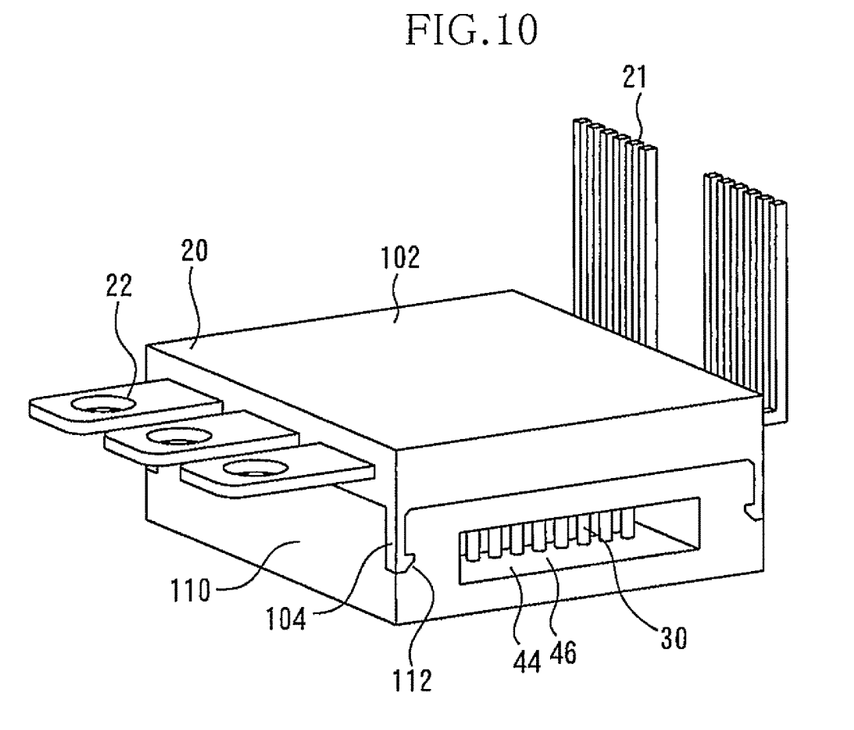
FIG. 10 is a perspective view of the completed semiconductor device.
Figure 11:
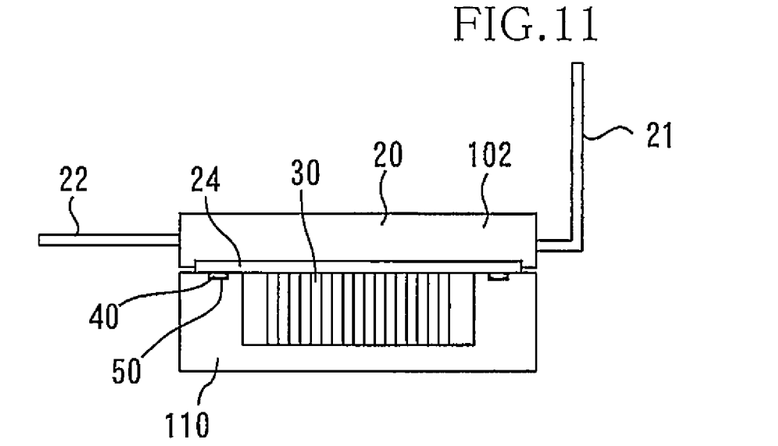
FIG. 11 is a sectional view of a portion of the semiconductor device including the O-ring.

FIG. 10 is a perspective view of the completed semiconductor device 100. The hooks 104 are elastically deformed to be fitted in the hook grooves 112, thereby fixing (snap-fit fixing) the cooling jacket 110 to the semiconductor module 102. FIG. 11 is a sectional view of a portion of the semiconductor device 100 including the O-ring 40. By the above-described snap-fit fixing, the O-ring 40 is elastically deformed to close the gap between the cooling jacket 110 and the semiconductor module 102. The cooling medium can thereby be enclosed in the cooling medium passage.

The hooks 104 formed in portions of the semiconductor module 102 and the hook grooves 112 formed in portions of the cooling jacket 110 do not increase the size of the semiconductor device 100. That is, no increase in size results from the provision of the hooks 104 and the hook grooves 112. Further, since the cooling jacket 110 is fixed to the semiconductor module 102 by snap-fit fixing, the assembly process can be performed markedly easily. Also, the number of component parts can be reduced in comparison with Embodiment 1. Further, the strength of the hooks 104 can be increased by tapering the base end portions of the hooks 104.

To obtain the above-described effects, the snap-fitting mechanism for fixing the semiconductor module to the cooling jacket may only be formed on the semiconductor module and the cooling jacket. Therefore, the arrangement may alternatively be, for example, such that hook grooves are formed in the semiconductor module while hooks are formed on the cooling jacket. The positions, sizes, shapes and the numbers of the hooks and the hook grooves can be changed as desired. For example, the number of hooks and the number of hook grooves may be increased in a case where a semiconductor module of an increased size is used.

Embodiment 5

Figure 12:
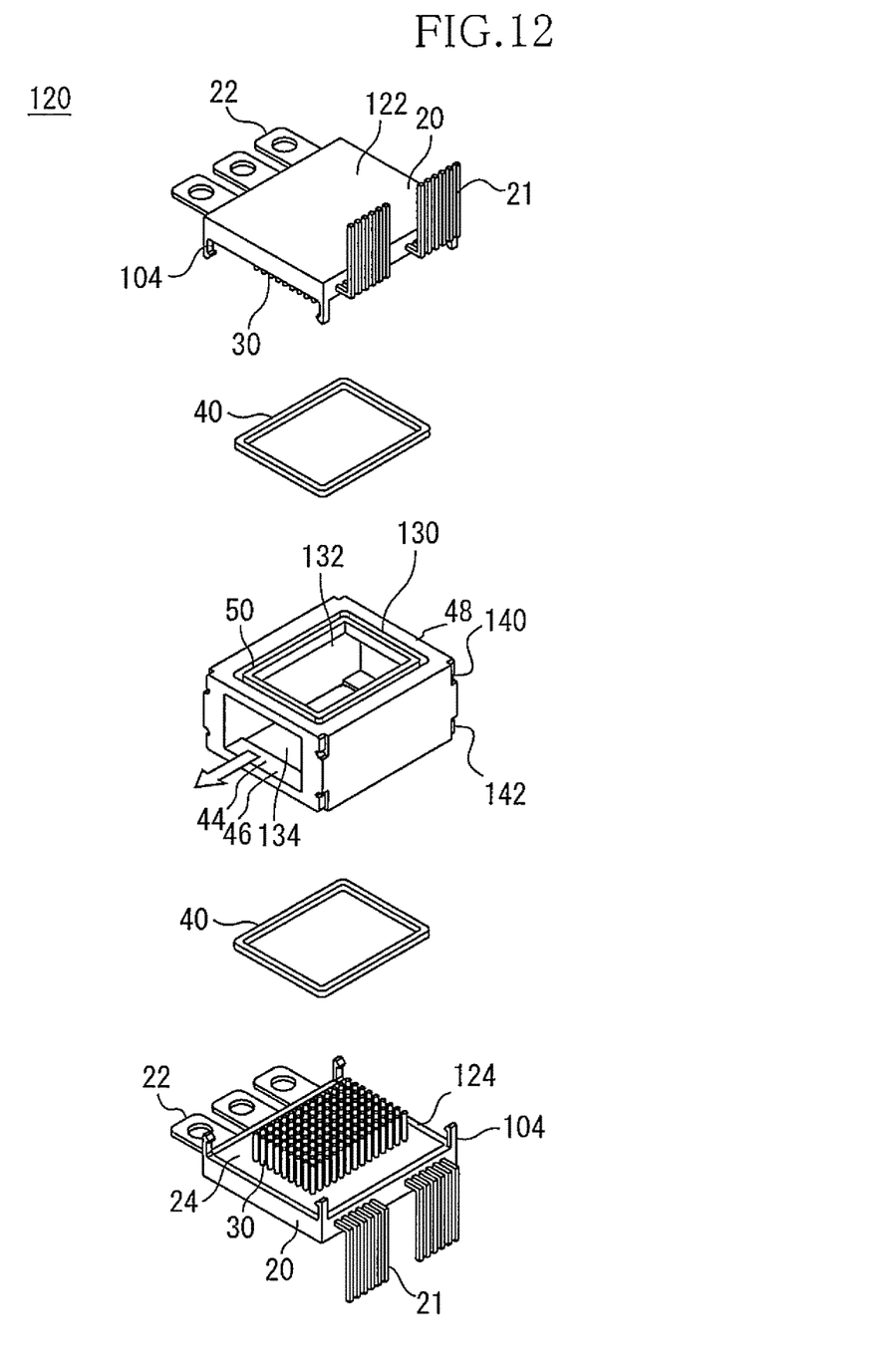
FIG. 12 is an exploded view of a semiconductor device according to Embodiment 5 of the present invention.

A semiconductor device according to Embodiment 5 of the present invention will be described mainly with respect to points of difference from the semiconductor device 100 according to Embodiment 4. FIG. 12 is an exploded view of a semiconductor device 120 according to Embodiment 5 of the present invention. The semiconductor device 120 includes semiconductor modules, namely, a first semiconductor module 122 and a second semiconductor module 124. Each of the first semiconductor module 122 and the second semiconductor module 124 is the same as the semiconductor module 102 in Embodiment 4.

A cooling jacket 130 has an introducing opening 132 at its upper surface side and has an introducing opening 134 at its lower surface side. The introducing opening 132 is formed for the purpose of introducing the plurality of cooling fins 30 of the first semiconductor module 122 into the cooling medium passage 44. The introducing opening 134 is formed for the purpose of introducing the plurality of cooling fins 30 of the second semiconductor module 124 into the cooling medium passage 44.

Four hook grooves 140 to be snap-fitted to the hooks 104 of the first semiconductor module 122 are formed in side surfaces of the cooling jacket 130 at the upper surface side of the same. Four hook grooves 142 to be snap-fitted to the hooks 104 of the second semiconductor module 124 are formed in side surfaces of the cooling jacket 130 at the lower surface side of the same.

Figure 13:
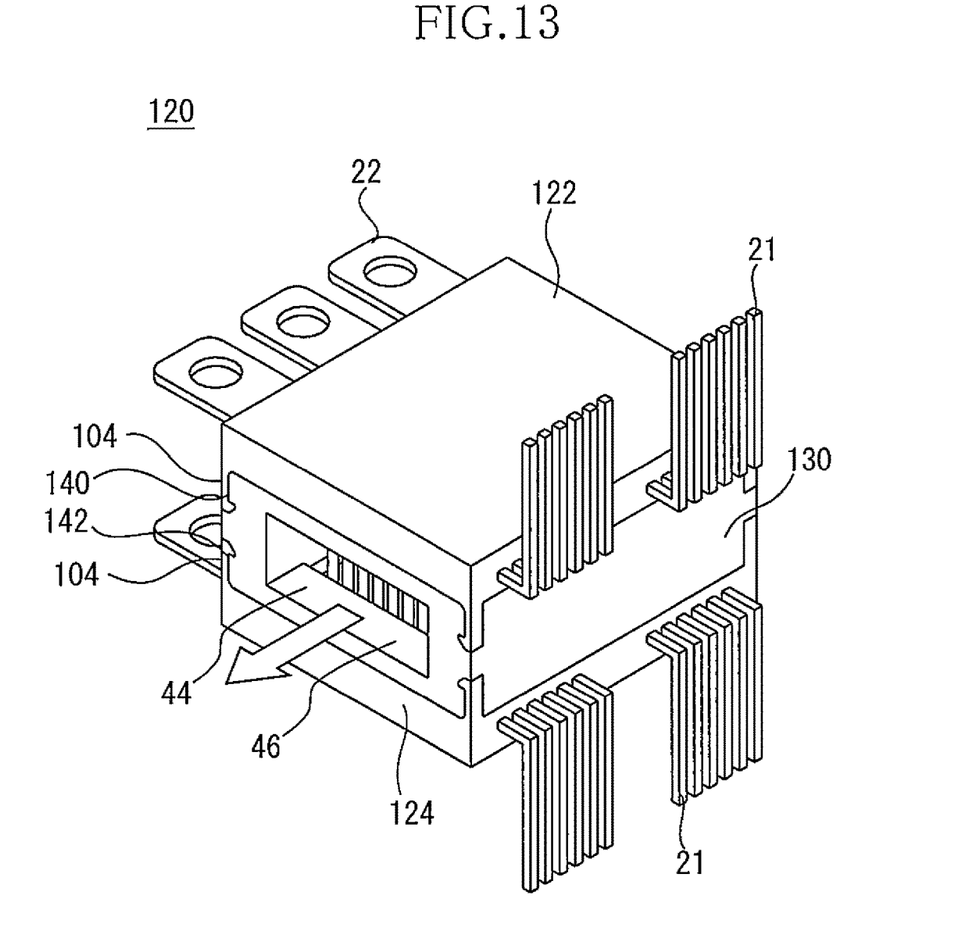
FIG. 13 is a perspective view of the completed semiconductor device.

FIG. 13 is a perspective view of the completed semiconductor device 120. The hooks 104 of the first semiconductor module 122 are fitted in the hook grooves 140, thereby fixing the first semiconductor module 122 to the cooling jacket 130 at the upper surface side of the same. The hooks 104 of the second semiconductor module 124 are fitted in the hook grooves 142, thereby fixing the second semiconductor module 124 to the cooling jacket 130 at the lower surface side of the same.

Figure 14:
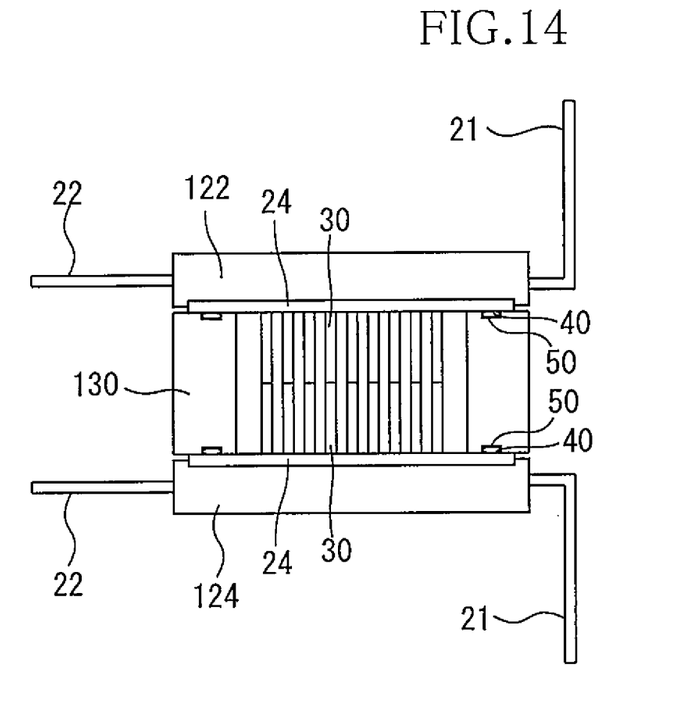
FIG. 14 is a sectional view of a portion of the semiconductor device including the O-rings.

FIG. 14 is a sectional view of a portion of the semiconductor device 120 including the O-rings 40. By the above-described snap-fit fixing, the O-ring 40 on the upper surface side of the cooling jacket 130 is elastically deformed to close the gap between the cooling jacket 130 and the first semiconductor module 122. Also, the O-ring 40 on the lower surface side of the cooling jacket 130 is elastically deformed to close the gap between the cooling jacket 130 and the second semiconductor module 124.

The semiconductor device according to Embodiment 5 of the present invention is capable of fixing the semiconductor modules both on the upper surface and on the lower surface of the cooling jacket 130 and is, therefore, capable of cooling the two semiconductor modules (first semiconductor module 122 and the second semiconductor module 124) with one cooling medium passage 44.

If the distance between the plurality of cooling fins 30 of the first semiconductor module 122 and the plurality of cooling fins 30 of the second semiconductor module 124 is reduced, variation in flow velocity distribution in the cooling medium passage can be inhibited to improve cooling efficiency. In Embodiment 5 of the present invention, the plurality of cooling fins 30 of the first semiconductor module 122 and the plurality of cooling fins 30 of the second semiconductor module 124 are brought into contact with each other, so that the variation in the flow velocity distribution in the cooling medium passage can be inhibited.

Embodiment 6

Figure 15:
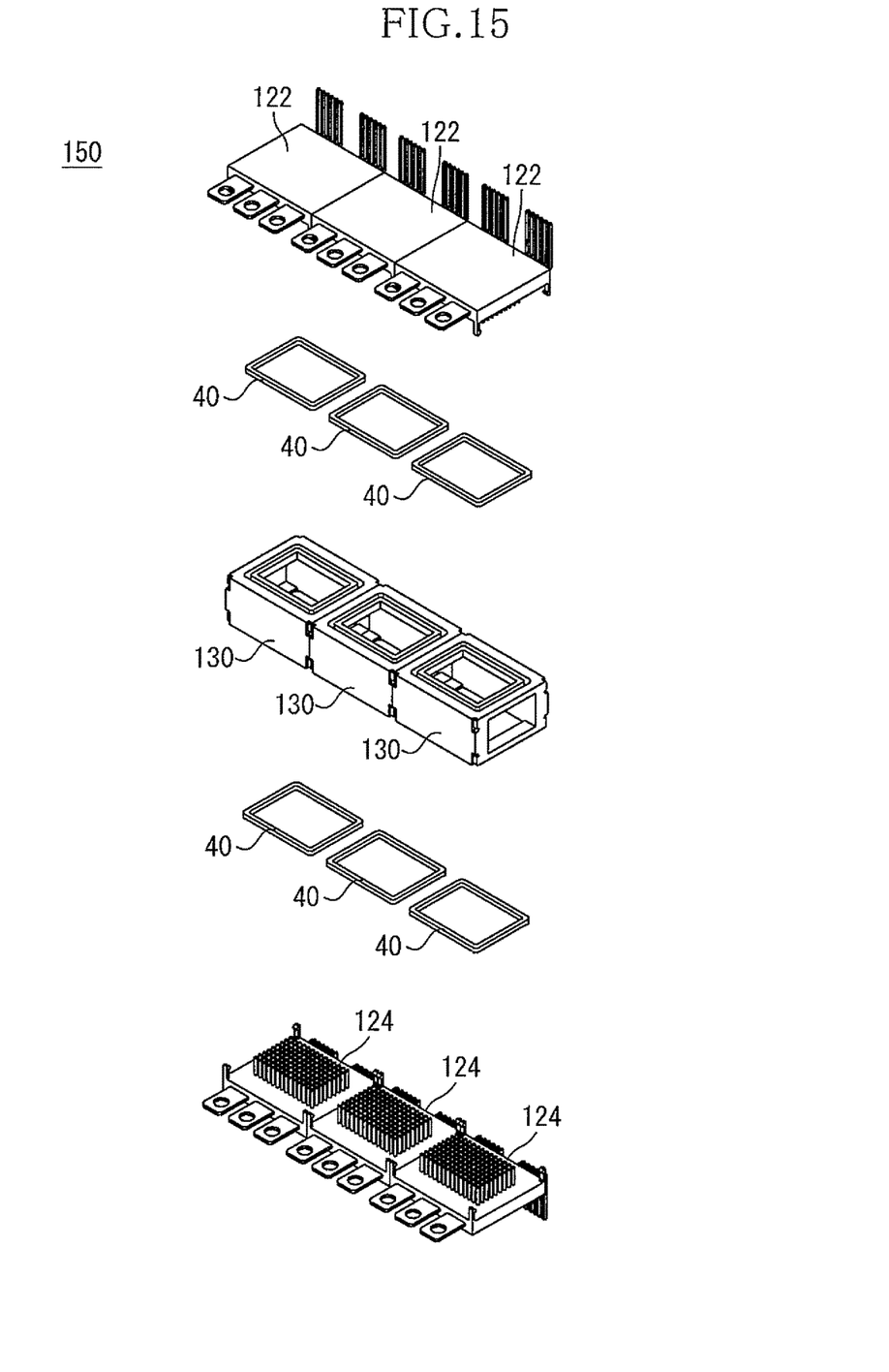
FIG. 15 is an exploded view of Embodiment 6 of the present invention.

A semiconductor device according to Embodiment 6 of the present invention is formed by connecting a plurality of (three) semiconductor devices 120 according to Embodiment 5. FIG. 15 is an exploded view of Embodiment 6 of the present invention. A plurality of cooling jackets 130 is connected so as to form one continuous cooling medium passage. Each adjacent pair of the cooling jackets 130 is fixed (connected) by means of a fitting structure capable of enclosing the cooling medium.

Figure 16:
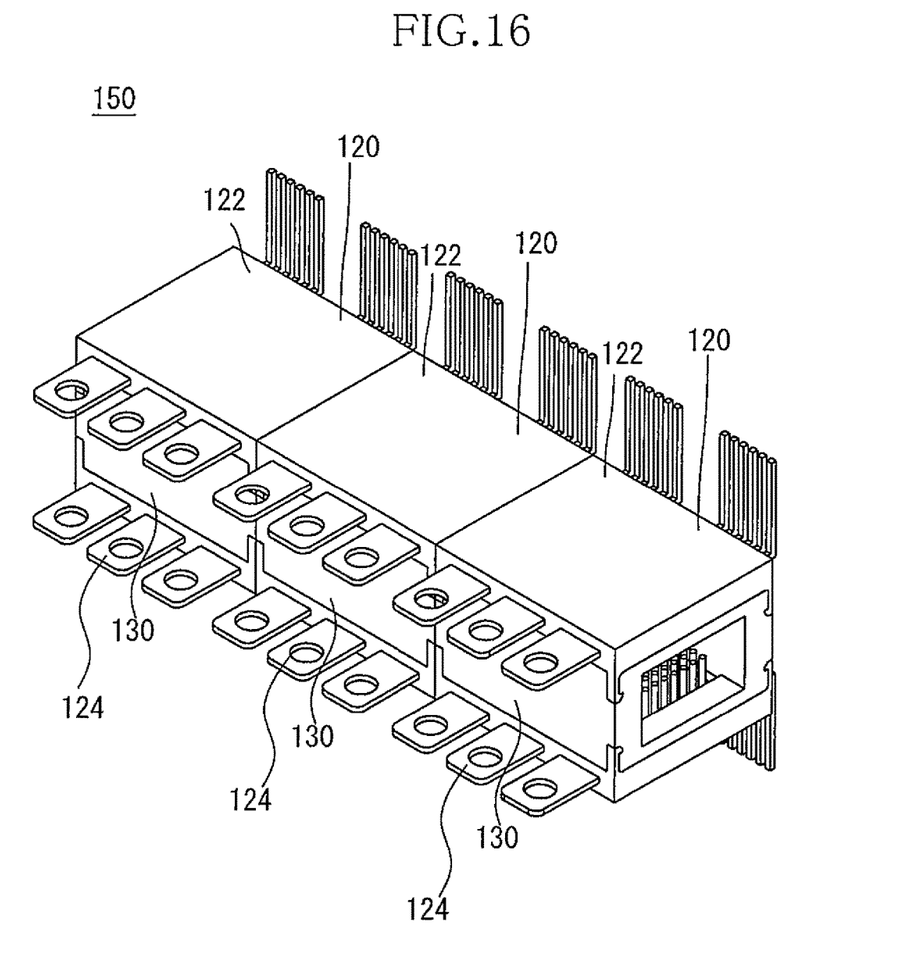
FIG. 16 is a perspective view of a completed semiconductor device.

FIG. 16 is a perspective view of a completed semiconductor device 150. The plurality of semiconductor modules (the three first semiconductor modules and the three second semiconductor modules) can be cooled with one cooling jacket 130. This way, the plurality of semiconductor modules constituting, for example, a three-phase inverter can be integrated in a small space.

The number of semiconductor devices 120 connected one another is not limited to any particular number. Also, a suitable combination of the features of the semiconductor devices according to the above-described embodiments can be made to improve the effects of the present invention.

DESCRIPTION OF SYMBOLS 10 semiconductor device, 12 semiconductor module, 14 cooling jacket, 20 molding resin, 21 control terminals, 22 main electrodes, 24 base plate, 30 cooling fins, 32 fixing cooling fin, 40,42 O-ring, 44 cooling medium passage, 46,48 passage openings, 49 introduction opening, 50 annular groove, 52 opening, 60 screw, 70 counterbore, 80 cooling jacket, 82 additional opening, 90 semiconductor module, 92 additional fixing cooling fin, 96 O-ring, 104 hooks, 104a base end portion, 112 hook grooves, 122 first semiconductor module, 124 second semiconductor module

The invention claimed is:

1. A semiconductor device comprising:
   a semiconductor module having a plurality of cooling fins and a fixing cooling fin longer than the plurality of cooling fins, the fixing cooling fin having a threaded hole provided in distal end portion thereof;
   a cooling jacket having a cooling medium passage in which the plurality of cooling fins and the fixing cooling fin are housed, and an opening formed so as to enable a screw to be inserted in the threaded hole; and
   a screw passed through the opening to be inserted in the threaded hole, the cooling jacket being fixed to the semiconductor module with the screw.

2. The semiconductor device according to claim 1, wherein the plurality of cooling fins are formed of a plurality of pin fins while the fixing cooling fin is formed of a boss.

3. The semiconductor device according to claim 1, wherein the distal end portion is housed in a counterbore formed in an inner wall surface of the cooling jacket, the semiconductor device further comprising an O-ring provided between the distal end portion and a bottom surface of the counterbore.

4. The semiconductor device according to claim 1, wherein an annular groove surrounding the plurality of cooling fins and the fixing cooling fin is formed in a surface of the cooling jacket opposed to the semiconductor module, the semiconductor device further comprising an O-ring provided in the groove, the O-ring closing a gap between the cooling jacket and the semiconductor module.

5. The semiconductor device according to claim 1, further comprising an additional fixing cooling fin longer than the plurality of cooling fins, the additional fixing cooling fin having a threaded hole provided in a distal end portion thereof,
   wherein an additional opening is formed in the cooling jacket so as to enable a screw to be inserted in the threaded hole in the additional fixing cooling fin, and
   wherein the additional fixing cooling fin is housed in the cooling medium passage, the semiconductor device further comprising an additional screw passing through the additional opening to be inserted in the threaded hole in the additional fixing cooling fin.

6. The semiconductor device according to claim 1, comprising a plurality of the semiconductor modules and a plurality of the cooling jackets, wherein the plurality of cooling jackets are connected so as to form one continuous cooling medium passage.

* * * * *